United States Patent [19]

Schwartz

[11] 4,439,736
[45] Mar. 27, 1984

[54] BATTERY TESTING SYSTEM

[75] Inventor: Frederick W. Schwartz, Providence, R.I.

[73] Assignee: Cable Electric Products, Inc., Providence, R.I.

[21] Appl. No.: 260,782

[22] Filed: May 13, 1981

[51] Int. Cl.³ ............................................ G01N 27/46
[52] U.S. Cl. ................................... 324/437; 324/435
[58] Field of Search ...................... 324/437, 435, 426; 46/45, 226, 228

[56] References Cited

U.S. PATENT DOCUMENTS 1,337,160  4/1920  Reibeth ................................ 324/437
2,708,735  5/1955  Sparr .................................... 324/437
3,707,055  12/1972  Pearce .................................. 46/228

OTHER PUBLICATIONS

1980 Radio Shack Catalog, Copyrighted 1979 Tandy Corporation, Fort Worth, Tex.

Primary Examiner—Michael J. Tokar
Assistant Examiner—Kevin D. O'Shea
Attorney, Agent, or Firm—Paul J. Sutton

[57] ABSTRACT

This invention discloses a portable battery tester having a single meter, and which is capable of receiving and yielding charge data for conventional portable batteries of a variety of popular sizes and shapes, within a chamber of varying accommodating size. Compensating electrical means engage the terminals of the batteries tested.

7 Claims, 5 Drawing Figures

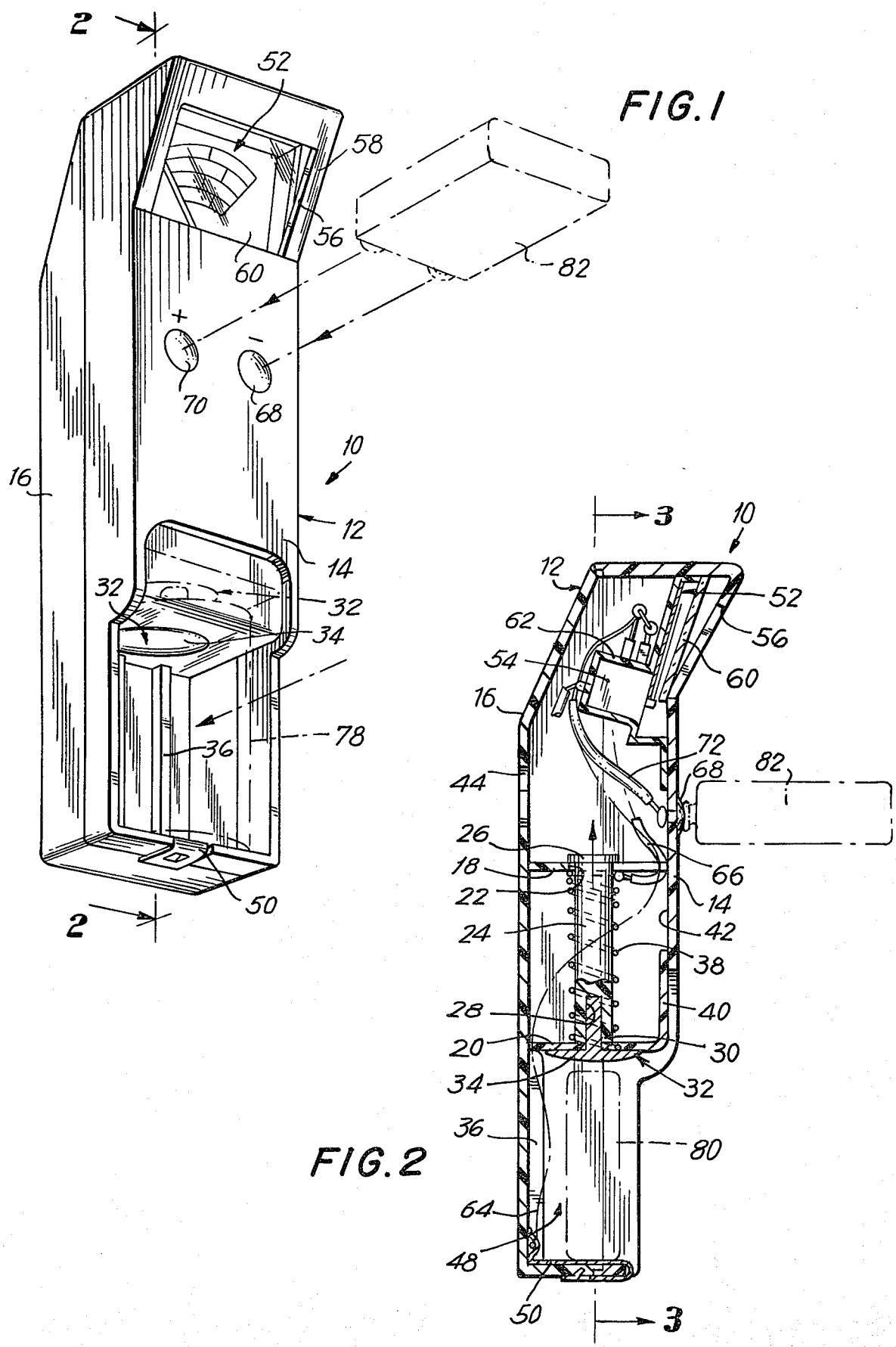

BATTERY TESTING SYSTEM

This invention relates generally to testing apparatus, and more specifically to a novel battery testing system and apparatus capable of exhibiting features unknown in any conventional device.

There has been a virtual explosion in the number of portable batteries being sold and used in our households and businesses. The reasons are not difficult to understand, what with the proliferation of electronic toys, flashlights, calculators, instruments and a host of other environments for electronic chips.

And yet, the number and designs of battery testers do not demonstrate much imagination when one considers that a need exists for a battery testing system or apparatus that is capable of giving the user, consumer and retail, the ability to rapidly confirm a proper charge on any number of standard sizes of portable battery, such as the common AA, C, D and 9 volt sizes as examples only.

The present invention seeks to meet this need by teaching what I will refer to as either a system or apparatus capable of satisfying these requirements in a device which enables hands-free readings of these charges from horizontal, inclined or vertical (wall mounted) surfaces. A retailer of various battery sizes and capacities will now according to this invention be provided with a relatively small and inexpensive counter or wall supported tester at or near the cash register which includes a battery-receiving chamber whose size is automatically varied to compensate for and receive batteries whose voltages are to be read. Reference to a single meter while only having to optionally hold the battery being tested will give the required information in a device which utilizes only a minute amount of the base charge as a meter voltage source.

Accordingly, it is an object of the present invention to provide a novel system and apparatus for testing portable-type batteries.

Another object of the present invention is to provide such a system and apparatus which will adjustably compensate for batteries of varying sizes and shapes within a single battery-receiving chamber.

A further object of this invention is to provide such a system and apparatus wherein a single meter carrying the necessary indicia is the only required reference zone for the voltage information from a variety of battery sizes.

Still a further object is to provide this novel system and apparatus capable of also reading information from batteries whose terminals need only contact externally located electrical contacts, without battery insertion.

Another object of the present invention is to provide such a system and apparatus in a relatively attractive, lightweight, and inexpensive embodiment capable of exhibiting with a single meter the results of multiple electrical circuit engagements.

These and other objects of the present invention are fulfilled, and limitations and disadvantages of prior art solutions are overcome, as will be clearly understood from the following description of specific embodiments of the invention, as examples only, together with the accompanying drawings wherein similar reference characters denote similar elements throughout the several views, in which:

FIG. 1 is a left front perspective type view of an embodiment of the present invention comprising a battery testing system;

FIG. 2 is a sectional elevational view taken along the line 2—2 of FIG. 1;

Figure 3:
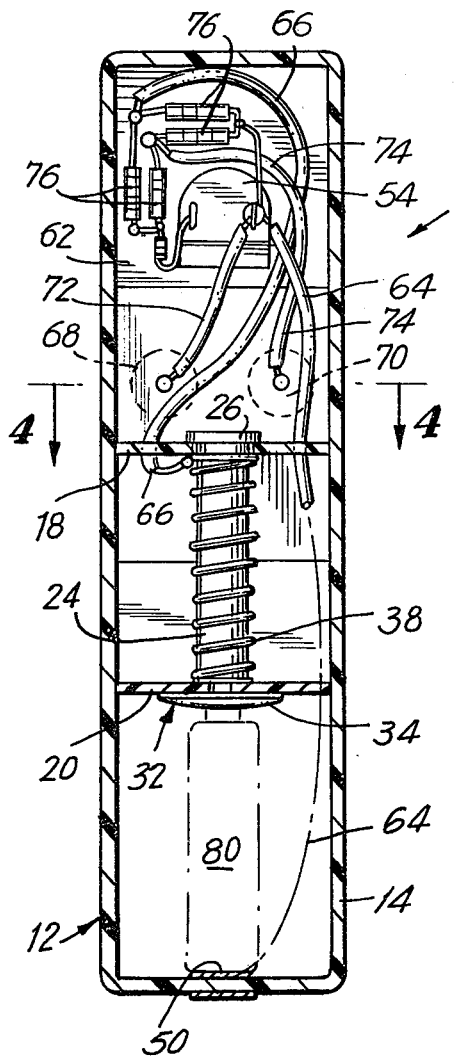
FIG. 3 is a sectional elevational view taken along the line 3—3 of FIG. 2.
Figure 4:
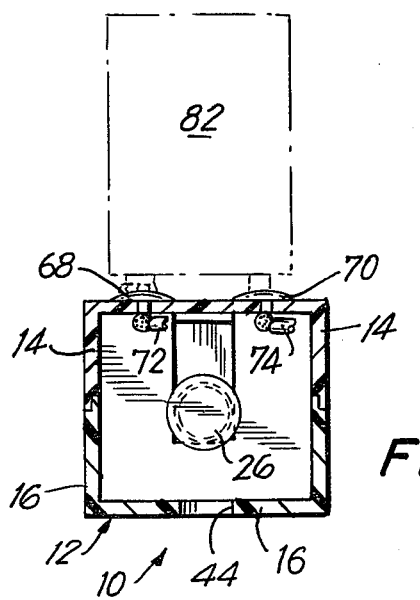
FIG. 4 is a sectional plan view taken along line 4—4 of FIG. 3.

Referring now in more detail to the drawings, FIG. 1 in a perspective-type of view illustrates a battery tester or system 10 in which a housing 12 is shown to consist of an upper half 14 and a lower half 16. It is important here before proceeding further to emphasize that the structural example as an embodiment of the present invention being described herein is only one of a variety of different types of structures that will accomplish the same purpose. In other words, while what will be described in this specification conforms to a production prototype, other variations and structures coming within the scope of the appended claims should readily suggest themselves to those skilled in the art.

As best seen in FIG. 2, housing 12 and its interior are divided by transversely extending members or walls 18 and 20 which themselves serve useful purposes. Wall 18, for example, is formed with a substantially centrally located opening 22 through which an upper portion of a carriage post 24 extends. The flanged end 26 of post 24, which is preferably of plastic or other inexpensive material, assures that there will be no escape of post 24 through opening 22 in wall 18. At its opposite end, post 24 is formed with a central opening 28, while its opposite end 30 abuts the upwardly facing surface of wall 20, as shown in FIG. 2.

An electrically conducting contact member 32 formed with a head portion 34 extends through an opening in wall 20 into the central opening 28 within carriage post 24. While wall or partition 18 is preferably stationary with respect to the housing halves 14 and 16, wall 20 is movable between a normal rest position shown in FIG. 2 at which it abuts and is limited by guide walls 36, and on its opposite side, a helical electrically conducting spring member 38 serves to position walls 18 and 20 with respect to one another, with wall 20 being spring biased as a result of spring 38 in a direction away from wall 18 to its limited rest position shown in FIG. 2.

Wall 20 assumes an overall L-shape, with an integral right-angled return leg 40 having outer surfaces which engage and slide against inner surfaces 42 of housing half 14.

A slotted opening 44 formed within lower housing half 16 through its rearwardmost surfaces facilitates mounting of the housing 12 upon any number of surfaces having a projection which is capable of entering and engaging the surfaces defining opening 44. Thus, the system 10 may be mounted upon a wall, or for that matter the entire housing 12 may be situated upon a horizontal or inclined surface that is convenient to the user.

Upper housing half 14 is formed with an opening 46, which defines part of a battery-receiving chamber 48 located within bottom portions of assembled housing 12.

Battery-receiving chamber 48 is defined at its upper end, at least in part, by head portion 34 of contact 32, while at its rearward side, upstanding guide walls 36 together with surfaces of lower housing half 16 serve to define part of this chamber. At the bottom end of chamber 48, a centrally located sheet metal contact 50 engages surfaces of both the upper and lower housing halves 14 and 16, and includes a right angle bend with a conductor-capturing opening.

A meter 52 having an indicating needle responsive to a mechanism 54 is visible through a window 56 formed in inclined face 58 of upper housing half 14. A transparent meter cover 60 prevents ingress of dirt and dust. Meter mechanism 54 is supported by a bracket 62 which, itself, is supported by interior surfaces of upper housing half 14. The user of battery tester or system 10 is able to gain voltage information by viewing the needle of meter 52 through window 56 in relation to backdrop indicia in the form of a meter scale. According to the present invention, this meter scale may either include bands, each of which corresponds to the type of battery to be tested, as will hereinafter be described, or may include a single band wherein the device and the circuitry compensates for the differing sizes, shapes and voltages of batteries capable of being tested with the present invention.

Meter 52 and its mechanism 54 are electrically connected to both contact member 32 and contact 50. This is accomplished by means of a conductor or wire 64 which extends from contact 50 to mechanism 54, and by means of a wire conductor 66 which electrically interconnects the spring member 38 with mechanism 54. It should be noted here that helical spring 38 is situated such that a portion thereof is in physical contact with the underside of the head portion 34 of contact 32, as best seen within FIG. 2. Thus, the placement of a voltage potential across contacts 32 and 50 will result in actuation of meter 52 and an indication on the meter face of the potential or charge across these contacts.

Another pair of contacts 68 and 70 assume the form of rivets secured to the front face of upper housing half 14, as shown in FIGS. 1 and 2. Wire conductors 72 and 74, respectively, interconnect contacts 68 and 70 with meter 52 and its mechanism 54, such that as in the case of contacts 32 and 50, the placement of a voltage potential across contacts 68 and 70 will result in a corresponding reading on the meter. Resistors 76 located within the upper portions of housing 12 provide the necessary circuit elements to accommodate meter 52.

In use, the embodiment of the present invention shown within FIGS. 1-4 can best be described as follows. Should the user wish to test the charge or potential of any one or more of the conventional AA, C or D-type batteries available on the market and wherein the positive and negative terminals are on opposite sides of these batteries, the user simply inserts the battery into the battery-receiving chamber 48 such that the negative battery terminal is in contact with contact 50. When doing so, the positive terminal of the battery comes into contact with contact 32 and, depending upon the size and length of the battery, contact 32 and its wall 20 move against the compressive biasing forces of helical spring 38 until the battery is able to comfortably be retained within the battery-receiving chamber 48. In other words, should the user insert an AA battery, or for that matter a C-size battery having the same overall length between terminals, the contact and its supporting wall 20 will move upwardly as shown in FIG. 2 from the original rest position to a position which will accommodate the entire battery within chamber 48. With the battery terminals in contact with contacts 32 and 50, the meter instantaneously gives a potential reading of the charge on the battery, thereby indicating to the user whether the battery is in a good condition and the extent of the charge thereon. The user need never let go of the battery if speed is important, and another battery may be rapidly inserted into contact with these electrical contacts 32 and 50 and subsequent readings taken.

Should the user wish to insert a larger battery, such as a D-size cell as an example, the same procedure is followed whereby in such a case while the negative terminal of the battery will be in contact with contact 50, the positive terminal of the battery will cause a forcing of contact 32 and its supporting wall 20 a greater distance toward wall 18 against the compressive biasing forces of spring 38, and the same procedure of taking a reading is accomplished. After each reading for each battery being tested in battery-receiving chamber 48, contact 32 and its supporting wall 20 return to the rest position shown in FIG. 2 in cross-section. It should be noted that the location and positioning of guide walls 36 is such that batteries corresponding to the sizes AA, C and D which are quite popular are automtically positioned with their terminals touching electrical contacts 32 and 50 when pushed the maximum distance into the battery-receiving chamber against these walls. Thus, these guide walls 36 serve the dual purpose of limiting the downward travel of contact 32 and its supporting wall 20 as well as serving to position the batteries to be tested within chamber 48.

For the convenience of the reader, a D-size cell 78 is shown in phantom outline in FIG. 1 within battery-receiving chamber 48, with the contact 32 likewise shown in phantom outline in its displaced position. On the other hand, a AA-size cell 80 is shown in phantom outline within battery-receiving chamber 48 in the view of FIG. 2, for purposes of illustration.

Another feature of the present invention available to the user resides in the ability of the user to similarly test batteries such as the 9 volt type which include positive and negative terminals on one end thereof. This is accomplished by utilizing contacts 68 and 70, as best shown in FIGS. 1 and 2, wherein a 9 volt battery 82 is shown both in exploded fashion and in contact with electrical contacts 68 and 70. By simply bringing the terminals into contact with the electrical contacts 68 and 70, the reading is instantly taken and the user knows at a glance that the charge on the battery is adequate or reflects the need for replacement. In the case of retail establishments which are entitled to credit on faulty battery merchandise, this fairly rapid testing not only saves the trouble of customer displeasure and the time require to make an exchange, but likewise gives the establishment information as to the quality of goods being delivered.

Figure 5:
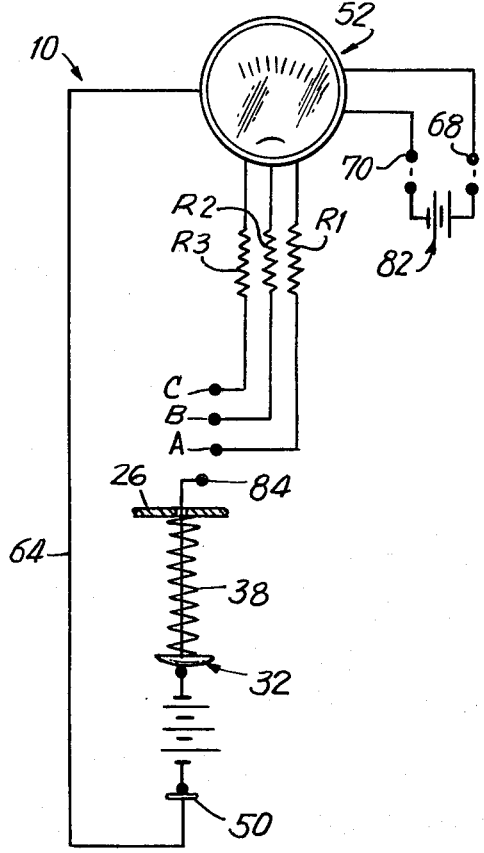
FIG. 5 is a schematic type view of an alternate embodiment of the present invention, as described below.

In an alternate preferred embodiment of my invention, I wish to teach a variation of the concept already described above, but wherein the need for separate bands of information on meter 52 are made unnecessary by means of the circuitry involved. Referring to FIG. 5, the same basic system 10 is disclosed. However, instead of fixed wiring in the form of permanently connected conductors 64 and 66 in electrical contact with contacts 32 and 50, only conductor 64 remains permanently connected as between contact 50 and meter 52. On the positive side of the circuit, the electrically conductive path between contact 32 and electrically conductive helical spring 38, a movable contact 84 in the form of a brush or other conductive configuration is secured in fixed relation with respect to the flanged end 26 of post 24. A plurality of contacts designated reference characters A, B and C located in the path of contact or brush 84 are, respectively, electrically interconnected to meter 52 by means of resistors R1, R2 and R3.

In use, should the user insert a relatively smaller battery which results in upward moving of contact 32 to a position whereby contact or brush 84 engages fixed contact A in its path, the value of resistor R1 which is predetermined will result in an indviualized reading of that size and voltage battery on meter 52. Should the user insert a larger battery which results in upward moving of contact 32 to a position whereby brush 84 contacts fixed contact B, likewise the value of predetermined resistor R2 will result in the user viewing a single meter band calculated to correspond to the value of the cell being tested. The same is true for the larger size battery which would result in engagement as between brush 84 and contact C, giving a reading on meter 52 through resistor R3. None of these variations interfere with the ability of system 10 to accommodate the 9 volt battery type shown schematically as reference character 82 in connection with external contacts 68 and 70 within FIG. 5.

The embodiments of the present invention particularly disclosed are presented merely as examples of the invention. Other embodiments, forms and modifications of this invention coming within the proper scope of the appended claims will, of course, readily suggest themselves to those skilled in the art.

What is claimed is:

1. An apparatus for indicating the condition of a plurality of portable power sources of different dimensions and voltages, comprising, in combination:
    a housing having means for support thereof on a surface, said housing having a first interior transversely extending wall and a second interior transversely extending wall spaced from said first wall, said first wall in part forming an opening, said second wall being movable relative to said first wall,
    a post connected to said second wall extending through said opening in said first wall, said post including means for preventing the escape of said post through said opening,
    an electrically conductive compression spring positioned around said post between said first and second walls, said spring having first and second ends at said first and second walls respectively, a first electrical contact connected to said second wall and electrically connected with said second end of said spring,
    a second electrical contact positioned in said housing spaced from said second wall,
    said housing forming a single chamber defined in part by said second electrical contact as said second wall and by said second electrical contact, said housing forming a chamber opening, said chamber being adapted to receive through said chamber opening a first or a second portable power source of greater dimension than said first power source, said first and second power sources having positive and negative terminals on opposite sides of said power sources, said negative terminals being in contact with said second electrical contact and said positive terminal being in contact with said first electrical contact, said first and second power sources providing electrical communication between said second and third electrical contacts,
    indicating means carried by said housing for providing a user with potential testing information with respect to and in response to the condition of said first or second portable power sources,
    electrically conductive means communicating with said indicating means and said first and second electrical contacts;
    said second wall and said first contact being movable from a rest position to a biased first position away from said second contact in response to the presence of said first portable power source in said chamber; said second wall and said first contact being further movable in a direction away from said second contact to a biased second position in response to the presence of said second portable power source in said chamber, and
    means connected to said housing for preventing said second wall from moving from said rest position toward said second electrical contact.

2. The apparatus according to claim 1, further including third and fourth spaced electrical contacts carried by said housing and additional electrically conductive means communicating with said indicating means and said third and fourth electrical contacts, said third and fourth contacts accommodate the terminals of a third portable power source having terminals disposed at one end of said third portable power source.

3. The apparatus according to claim 2, wherein said first power source is an AA battery or a C-size battery.

4. The apparatus according to claim 3, wherein said second power source is a D-size battery.

5. The apparatus according to claim 4, wherein said third power source is a 9 volt battery.

6. The apparatus according to claim 5, wherein said indicating means comprises a meter of the swing needle type that carries information that will accommodate all voltages of batteries able to be tested according to the present invention.

7. The apparatus according to claim 6, wherein said apparatus is characterized by the absence of any power source other than the portable power source to be tested utilizing the present invention.

* * * * *